(12) United States Patent
Funada (10) Patent No.: US 7,595,510 B2
(45) Date of Patent: Sep. 29, 2009

(54) SEMICONDUCTOR LASER MODULE IMPROVED IN HIGH FREQUENCY RESPONSE

(75) Inventor: Tomoyuki Funada, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/138,766

(22) Filed: May 27, 2005

(65) Prior Publication Data

US 2005/0271334 A1   Dec. 8, 2005

(30) Foreign Application Priority Data

May 27, 2004   (JP) .............. 2004-157914

(51) Int. Cl.
*H01L 29/16* (2006.01)

(52) U.S. Cl. .............. 257/82; 438/22; 438/24; 257/E33.076

(58) Field of Classification Search .......... 257/82, 257/93, E33.076
See application file for complete search history.

(56) References Cited

U.S. PATENT DOCUMENTS

| 4,827,481 | A | * | 5/1989 | Sasaki ............... 372/31 |
| 5,504,349 | A | * | 4/1996 | Yoshino ............ 257/82 |
| 6,072,816 | A | * | 6/2000 | Shin'e ............. 372/38.02 |
| 2002/0141142 | A1 | * | 10/2002 | Rookes ............ 361/538 |
| 2003/0038290 | A1 | * | 2/2003 | Aizawa et al. ........ 257/80 |
| 2003/0183834 | A1 | * | 10/2003 | Kohmoto et al. ..... 257/98 |

FOREIGN PATENT DOCUMENTS

JP          07-058413       3/1995

* cited by examiner

*Primary Examiner*—Thao X Le
*Assistant Examiner*—Ajay K Arora
(74) *Attorney, Agent, or Firm*—McDermott Will & Emery LLP (57) ABSTRACT

The present invention reduces the radiation noise and the degradation of the optical waveform appeared in the output of the laser module. The laser module of the present invention comprises the laser diode, the photodiode, and the resistor, which are mounted on the stem of the laser module. The stem includes four lead terminals, one of which is commonly connected to the laser diode ad the photodiode via the resistor. Therefore, the leak of the modulation current applied to the lead terminal, to which the laser diode and the photodiode are commonly connected, may be reduced.

17 Claims, 9 Drawing Sheets

SEMICONDUCTOR LASER MODULE IMPROVED IN HIGH FREQUENCY RESPONSE

BACKGROUND OF THE INVENTION

1. Field of the Invention

The present invention relates to a laser module installing a laser diode and a photodiode therein.

2. Related Prior Art

A laser module with a metal stem mounting a laser diode thereon is well known in the field. For example, a Japanese patent published as H07-058413 has disclosed such laser module with four lead terminals, one of which is directly connected to the metal stem and the other of terminals are electrically isolated from the stem. When two devices, the laser diode and the photodiode, are installed in the module with three terminals electrically isolated from the stem, two of electrodes, among the anode and cathode electrodes of the laser diode and those of the photodiode, must be commonly connected to one terminal. One of the cathode and anode electrodes of the photodiode and one of the cathode and anode electrodes of the laser diode must be commonly connected to each other.

In particular, when the laser diode in the module is driven in the differential-driving mode, not only the optical waveform output from the laser diode may be perturbed but also the radiation noise may be induced. This is because the modulation current leaks to the photodiode via the terminal to which the laser diode and the photodiode is commonly connected.

In the case that the module may provide five or more lead terminals, the subject above mentioned does not become any problem. However, a package with such many lead terminals is not popular and does not show any cost merit. A package with four lead terminals, one of which is directly connected to the stem, for a semiconductor device is typically used for some electrical and optical devices.

Therefore, one of objects of the present invention is to provide a laser module capable of suppressing the ripple in the frequency response of the optical output and reducing the induced noise with limited count of lead terminals.

SUMMARY OF THE INVENTION

One aspect of the present invention relates to a laser diode module that comprises a laser diode, a photodiode, a stem, and a resistor. The laser diode, the photodiode, and the resistor are mounted on the stem, The photodiode monitors the light emitted from the laser diode. The stem includes at least one lead terminal that is commonly connected to one electrodes of the laser diode and one electrodes of the photodiode. The resistor is connected between the lead terminal and the electrodes of the photodiode.

In the present laser module, since the resistor is inserted between the lead terminal, namely, the signal lead terminal, and an electrode of the photodiode, the photodiode may be isolated in electrical from the modulation signal applied to the signal lead terminal. Accordingly, not only the modulation signal applied to the signal lead terminal may not be degraded but also high frequency components involved in the modulation signal may not affect the monitoring accuracy.

The laser diode module of the invention may further comprise a cap, provided on the stem, for covering the laser diode, the photodiode, and the resistor. Accordingly, the laser diode module may constitute a co-axial package.

The photodiode may be mounted on the stem via a first sub-mount, while the resistor may be mounted on the stem via a second sub-mount different to the first sub-mount. Or, the photodiode and the resistor may be commonly mounted on a sub-mount. The sub-mount facing the stem may be a die capacitor with an upper electrode for mounting the photodiode thereon and a lower electrode facing the stem.

In this arrangement, the resistor and the die capacitor mounting the photodiode may form a high-cut filter. Accordingly, the modulation signal applied to the signal lead terminal may not be further degraded and the monitoring accuracy for the optical output from the laser diode may be further enhanced.

In the laser diode module, the photodiode and the resistor may be monolithically formed within a semiconductor substrate. In this configuration, an area for installing the resistor may further shrunk, thereby enabling to miniaturize the laser module.

The laser diode module of the present invention may further include another lead terminal connected to the other electrodes of said laser diode. In this configuration, the laser diode may be driven in a differential mode. That is, a first signal with a first phase is provided to the lead terminal and a second signal with a second phase opposite to the first phase is provided to the other lead terminal.

Another aspect of the present invention relates to a light transmitting apparatus, which comprises a laser diode module and a driver. The laser diode module includes a laser diode, a photodiode, a stem, and a resistor. The photodiode monitors light emitted from the laser diode. The stem mounts the laser diode, the photodiode, and the resistor thereon. Also, the stem includes a signal lead terminal, a ground terminal, and a monitor lead terminal. The signal lead terminal is commonly connected to an electrode of the laser diode and an electrode of the photodiode. The monitor lead terminal is connected to the other electrode of the photodiode. The ground lead terminal is connected to the stem. The resistor is inserted between the signal lead terminal and the electrode of the photodiode. The driver has a first output terminal connected to the signal lead terminal.

In the light transmitting apparatus of the invention, the stem of the laser diode module may further include another signal lead terminal connected to the other electrode of the laser diode. The driver may further comprise a second output terminal connected to the other signal lead terminal. Accordingly, the laser diode may be driven in a differential mode. That is, a first singal with a first phase is applied to the signal lead terminal and a second signal with a second phase opposite to the first phase is applied to the other signal lead terminal.

In the light transmitting apparatus of the invention, the photodiode in the laser diode module may be electrically isolated from the modulation signal by the resistor inserted between the signal lead terminal, which is commonly connected to the laser diode and the photodiode, and the photodiode. Accordingly, not only the modulation signal applied to the signal lead terminal may not be degraded but also high frequency components involved in the modulation signal may not affect the monitoring accuracy.

BRIEF DESCRIPTION OF DRAWINGS

FIG. 6A shows a frequency response of the modulation current of the laser diode when the resistor is connected to the photodiode, while

FIG. 7A shows the frequency response of the monitored signal Vmon and the bias voltage Vpd with a series resistor, while

DESCRIPTION OF PREFERRED EMBODIMENT

Next, preferred embodiments of the present invention will be described as referring to accompanying drawings. In the drawings and their explanations, same elements will be referred by the same numerals or symbols without overlapping description.

First Embodiment

Figure 1:
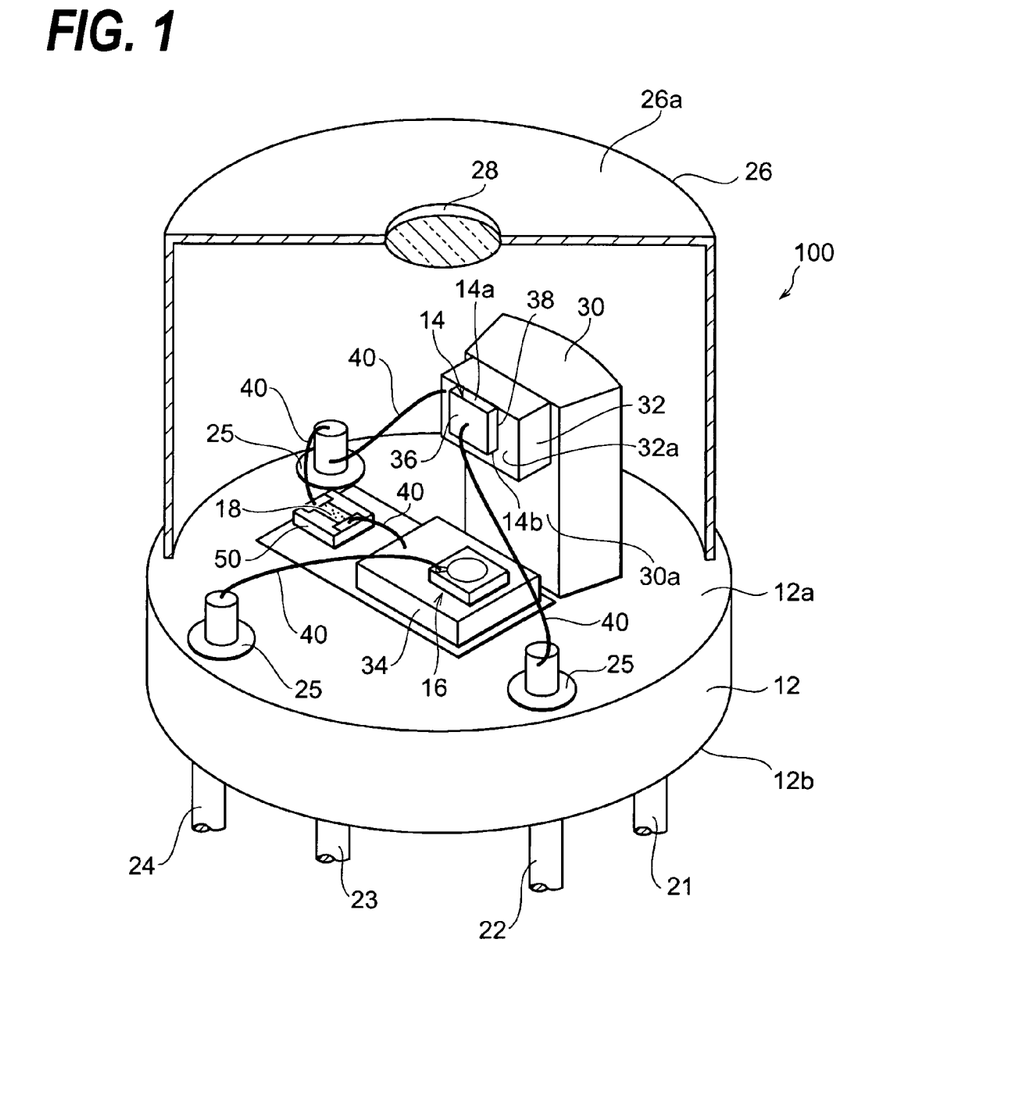
FIG. 1 is a partially cutaway perspective view of the laser module according to the first embodiment of the invention.

FIG. 1 is a partially cutaway perspective view of a laser module 100 according to the first embodiment of the present invention. The laser module 100 has a CAN-type package, or so called as a co-axial type package, which includes a stem 12, a laser diode 14 mounted on the stem 12, and a photodiode 16. On the stem 12 is also provided with a resistor 18.

The stem 12 has a disk shape having two surfaces 12a and 12b parallel to each other and is made of electrically conductive material, such as iron (Fe) plated with nickel (Ni). The laser diode 14, the photodiode 16, and the resistor 18 are mounted on the surface 12a.

The stem 12 includes four lead terminals 21 to 24. The lead terminal 21 extrudes from the surface 12b of the stem 21 and is directly connected to the stem 12. The rest lead terminals, 22 to 24, pass the stem 12 filled with seal glass 25 in the gap to the stem 12 to isolate in electrical therefrom and extrude their tips from the surface 12a.

On the surface 12a is provided with a metal block 30, or the metal block 30 may be integrally formed with the stem 12. The block 30 has a rectangular shape extending in perpendicular form the surface 12a and has a side surface 30a perpendicular to the surface 12a of the stem 12.

On the side surface 30a of the block 30 is mounted with a sub-mount 32 for mounting the laser diode 14, which has a function of heat sink for the laser diode. The sub-mount is typically made of insulating material and a surface 32a, on which the laser diode is mounted, is covered with an electrically conductive material.

The laser diode 14, having an anode electrode 36 and cathode electrode 38, is fixed on the conductive layer 32a of the sub-mount 32. The anode electrode 36 is bonded to the lead terminal 22 with a bonding wire 40, while the cathode electrode 38, electrically conducted to the conductive layer 32a on the sub-mount 32, is electrically coupled to the lead terminal 32 with a bonding wire 40. Thus, when the laser module 100 operates, the laser diode 14 emits an optical signal by providing the modulation current and the bias current from a driving circuit connected to the lead terminals 22 and 23.

Figure 2:
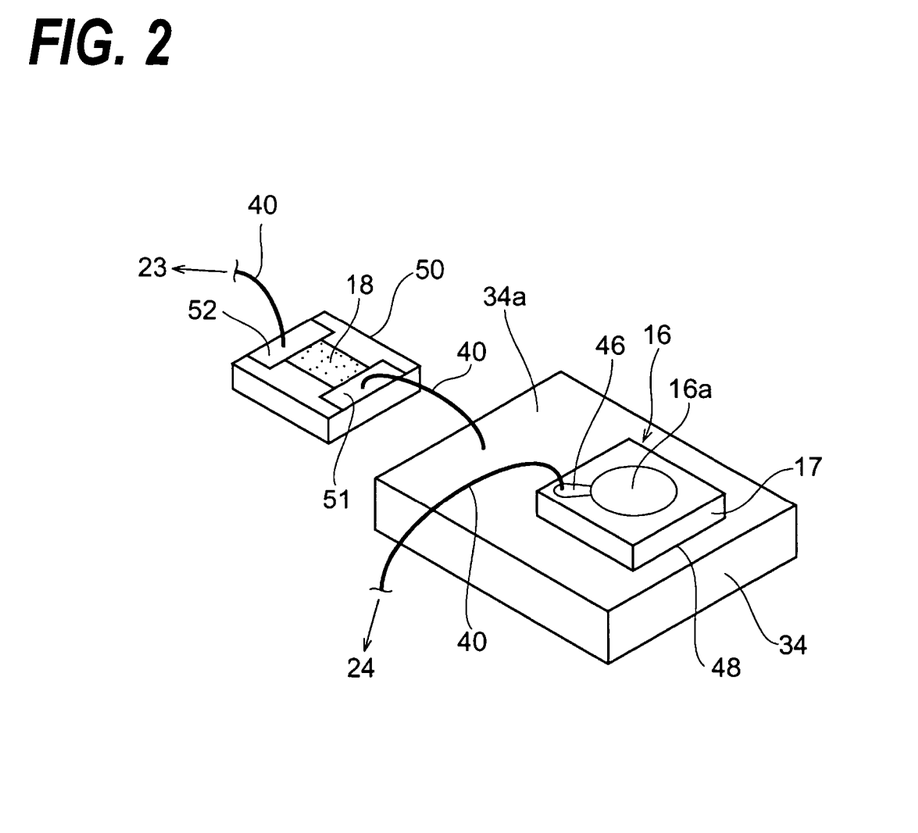
FIG. 2 is an expanded view showing the photodiode and the resistor of the laser module.

Next, as referring to FIG. 2, the function of the resistor 18 for the photodiode 16 will be described. FIG. 2 is an expanded view showing the photodiode 16 and the resistor 18.

The photodiode 16 is a light-receiving device for monitoring the optical output of the laser diode 14. The photodiode 16 includes an optical sensitive area 16a, which contains a plurality of semiconductor layers forming a p-n junction or a p-i-n junction. In the present embodiment, the sensitive area has a mesa structure, but not restricted to the mesa structure. The optical sensitive area 16a faces the rear facet 14b of the laser diode 14, which is shown in FIG. 1, to detect the optical power emitted from the rear facet 14b and to output a corresponding electrical signal.

The photodiode 16 further provides an anode electrode 46 and the cathode electrode 48, these electrodes 46 and 48 are respectively formed on the top and bottom surfaces of the semiconductor substrate 17, in which the photodiode 16 is formed. The anode 46 of the photodiode 16 is connected to the lead terminal 24 via the bonding wire 40. When the laser module 100 is practically operated, the lead terminal 24 is connected to the control circuit provided outside of the laser module 100. This control circuit, receiving the electrical signal from the photodiode 16, adjusts the bias current to control the optical output power of the laser module 100.

The photodiode 16 is mounted on the sub-mount 34. The sub-mount 34 is a member made of insulating material for placing the photodiode 16 thereon. The surface 34a on the sub-mount where the photodiode 16 is placed thereon is covered with an electrically conductive material, whereby the photodiode 16 is fixed on the conductive layer 34a and the cathode electrode 48 of the photodiode 16 is electrically conducted to the conductive layer 34a. In a modification, the sub-mount 34 may be a die capacitor with an upper electrode 34a and a lower electrode. In this case, the cathode electrode 48 of the photodiode 16 is grounded in the alternating current via the die capacitor 34.

The resistor 18 is, so called, a thin film resistor formed on an insulating substrate 50 with a rectangular shape. The resistor 18 is made of, for example, NiCr and TaN. The insulating substrate 50 is fixed on the surface 12a of the stem 12. Thus, the resistor 18 is electrically isolated from the stem 12. On the top surface of the substrate 50 is provided with pads 51 and 52 for the wire bonding. They are in contact to both ends of the resistor 18. The pad 51 is connected to the conductive layer 34a on the sub-mount 34 with the bonding wire 40, while the pad 52 is connected to the lead terminal 23 with another wire 40. Thus, the resistor 18 is connected in serial to the photodiode 16.

Referring to FIG. 1 again, the surface 12a of the stem provides a cap 26 to cover the laser diode 14, the photodiode 16, and the resistor 18. The cap 26 may be made of metal such as iron (Fe) and stainless steel. On the ceiling 26a of the cap 26 is provided with a lens 28 to focus the light emitted from the front facet 14a of the laser diode 14. The focused light is output from the laser module 100. Thus, the laser module 100 according to the present invention constitutes a CAN-type, namely, a co-axial type configuration.

Figure 3:
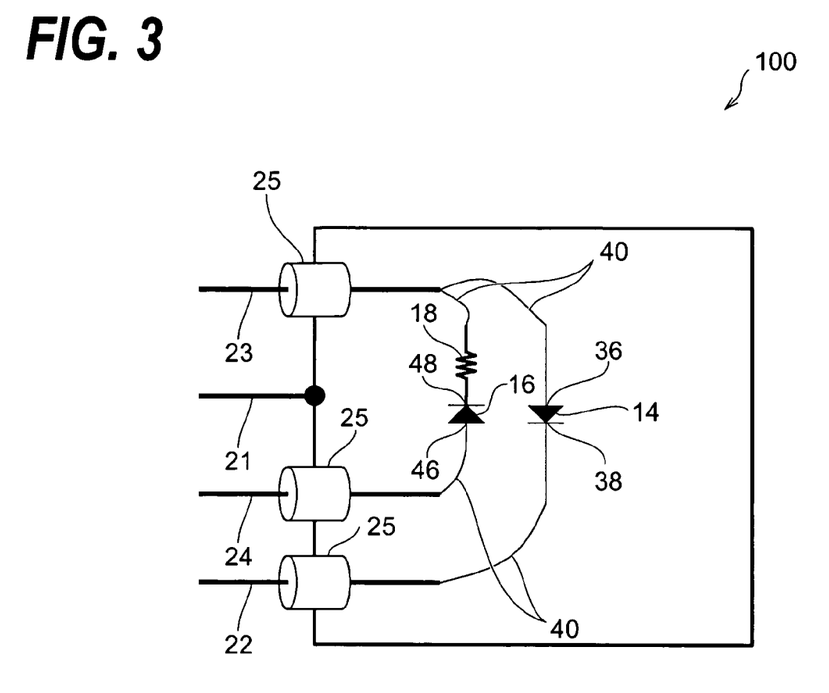
FIG. 3 is an equivalent circuit diagram of the laser module of the first embodiment.

FIG. 3 is an equivalent circuit diagram of the laser module 100. The anode electrode 36 of the laser diode 14 and the cathode electrode of the photodiode 16 are commonly connected to the lead terminal 23. Between the lead terminal 23 and the cathode electrode 47 of the photodiode is connected with the resistor 18.

Figure 4:
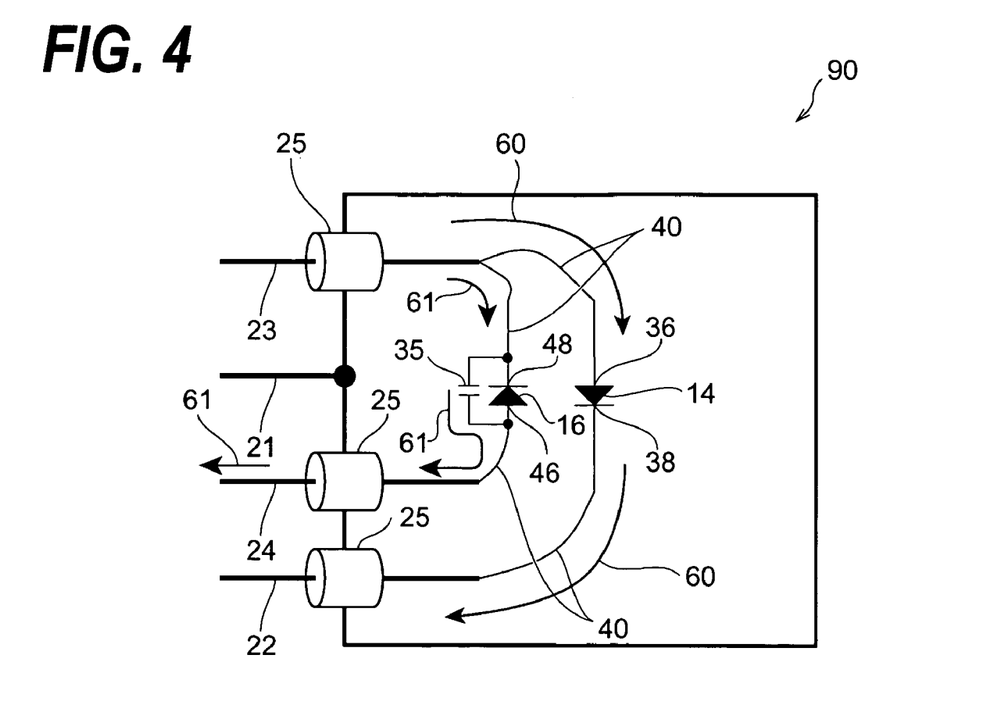
FIG. 4 is a conventional circuit diagram of the modified embodiment.

In the following, the function of the present invention will be described as comparing to a conventional circuit diagram shown in FIG. 4. In the conventional laser module 90, shown in FIG. 4, the resistor 18 appeared in the present invention is removed from the module 100. A capacitor, denoted as the numeral 35, stands for the parasitic capacitance attributed to the photodiode 16. The modulation current 60 is provided to the laser diode 14 from the driver via the lead terminal 23. However, portion of the modulation current 60 may leak to the lead terminal 24 via the parasitic capacitance 36 from the lead terminal 23. Thus, in the conventional module 90, a portion of the modulation current 60 flows through the photodiode 16 as a leak current 61. This perturbs the frequency response of the laser module 90 observed from the laser driver and so do the waveform of the optical output of the laser module 90. Moreover, the leak current 61 not only becomes a source of the radiation noise, but also induces a voltage offset in the control circuit connected to the lead terminal 24, which perturbs the monitoring accuracy of the photodiode 16.

On the contrary in the present invention, the laser module 100 provides the resistor 18 between the photodiode 16 and the lead terminal 23. Therefore, the modulation current 60 applied to the lead terminal 23 may be isolated from the photodiode 16, thereby reducing the leak current 61 flowing through the photodiode 16. Therefore, the degradation of the frequency response of the laser module 100 may be reduced, thereby stabilizing the optical output waveform from the laser module 100. Further, not only the radiation noise due to the leak current may also be eliminated, but also the bias voltage supplied to the photodiode 16 may be stabilized. The voltage offset induced in the control circuit, which is connected to the lead terminal 24, may be reduced, accordingly, the optical output of the laser module 100 may be precisely monitored. Moreover, in the configuration that the photodiode 16 is mounted on the die capacitor mentioned previously, the die capacitor and the resistor 18 forms a type of the high-cut filter. Therefore, most of the high frequency component of the leak current passing the resistor 18 may be filtered in this low-pass filter not to output from the lead terminal 24. Accordingly, the optical output from the laser module 100 can be further precisely monitored.

The resistance of the resistor 18 is preferably from 50 $\Omega$ to 3 K$\Omega$. The resistance less than 50 $\Omega$ may be insufficient to isolated the modulation current 60 from the photodiode 16. On the other hand, the resistance greater than 3 k$\Omega$ generates an excess voltage drop by the current generated by the photodiode 16, which decreases the bias voltage supplied to the photodiode 16.

Next, a simulation for the equivalent circuit of the laser module 100 with the resistor 18 will be described as referring to FIG. 5, in which the laser diode 14 is connected to the driver 65.

The driver 65 comprises a differential circuit 70 and a current source 80 for generating the bias current. The differential circuit 70 provides an output terminal 82 connected to the lead terminal 22 via the capacitor 72 for the non-inverting signal and another output terminal 83 connected to the lead terminal 23 via the capacitor 73 for the inverting signal. Where, the modulation signal in in-phase to the input signal 71 is output from the output terminal 82, while another modulation signal in anti-phase to the input signal 71 is output from the output terminal 83. Accordingly, the differential circuit provides the modulation current corresponding to the difference between the in-phase signal and the anti-phase signal to the laser diode 14. The current source 80 is connected to the lead terminal 22 via the inductor 79 to provide the bias current to the laser diode 14. Therefore, the superposed current, the bias current on the modulation current, is supplied to the laser diode 14 to emit the optical signal therefrom.

The lead terminal 23 is connected to the signal ground 75 via the inductor 74, while the lead terminal 21 is connected to the case ground 76 which stands for the electrical level of the stem 12. The anode and cathode electrodes of the laser diode 14 are connected dumping resistors 77 and 78, respectively, on the sub-mount 32. Finally, the lead terminal 24 is led to the control circuit that is not shown in FIG. 5.

Figure 5:
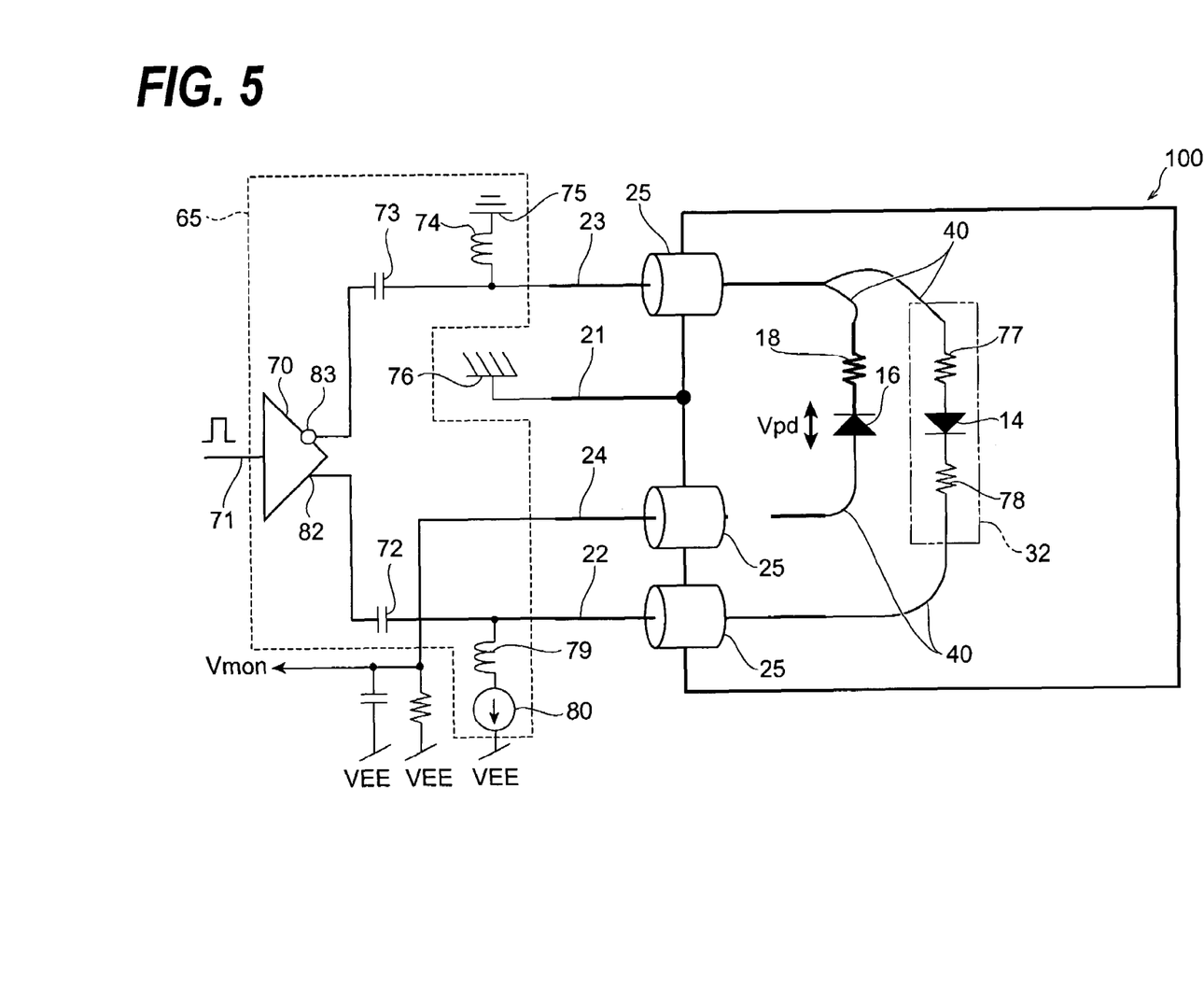
FIG. 5 is a circuit diagram for evaluating the frequency characteristic of the laser module.
Figure 6A:
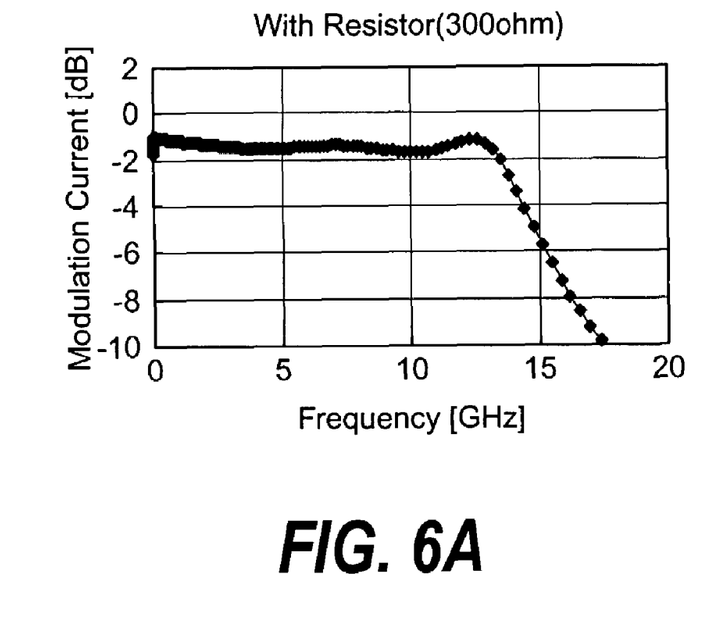
Figure 6B:
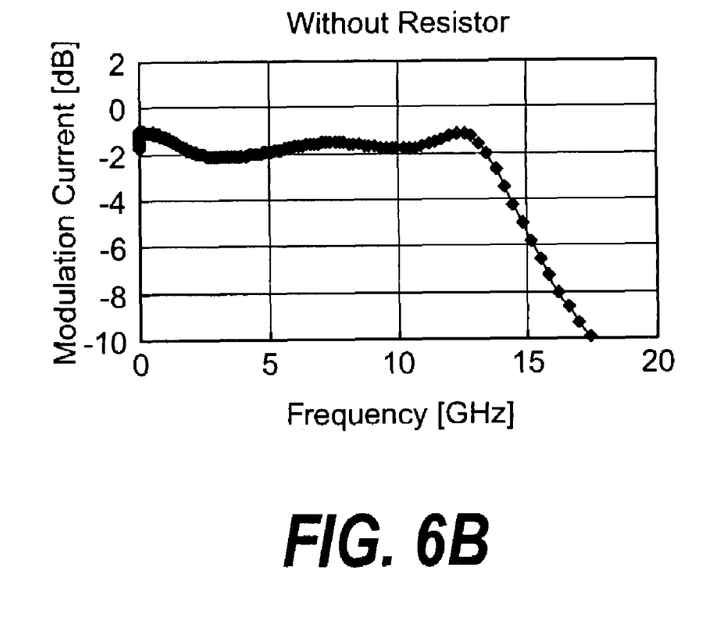
FIG. 6B shows a frequency response of the modulation current when the resistor is not connected to the photodiode.

FIG. 6A shows a frequency response of the modulation current supplied to the laser diode 14, while FIG. 6B shows another frequency response when the resister 18 in FIG. 5 is removed. In these figures, the horizontal axis denotes the frequency, while the vertical axis denoted the ratio of the modulation current supplied to the laser diode against the current generated in the driver 65. The resistance of the resistor 18 is set to be 300 $\Omega$. As shown in figures, the frequency response for the module with the resistor 18 improves the flatness thereof compared with the module without the resistor, which means that the output characteristic of the laser module 100, in particular in the output waveform thereof, may be improved as the flatness in the frequency response is improved.

Figure 7A:
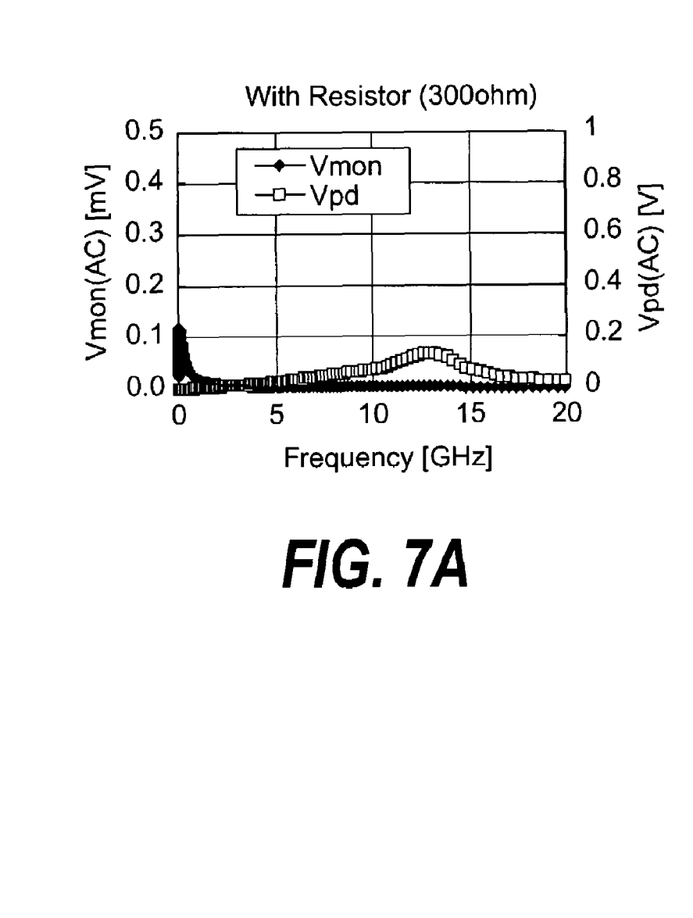
Figure 7B:
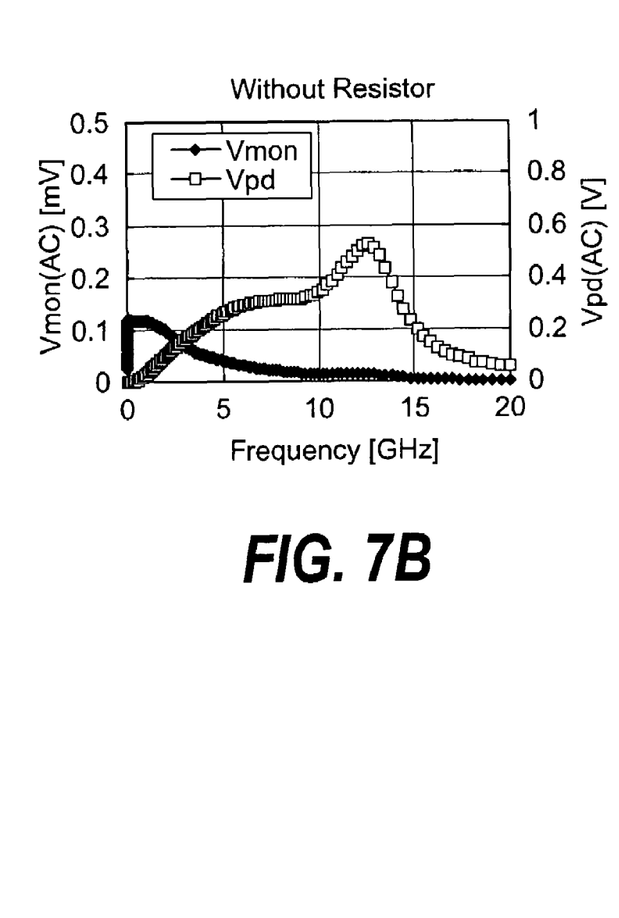
FIG. 7B shows the frequency response of the monitored signal and the bias voltage without the series resistor.

FIG. 7A and FIG. 7B show the frequency response of the monitor signal Vmon and the bias voltage Vpd applied between electrodes of the photodiode. FIG. 7A corresponds to the result for the module with the resistor 18, while FIG. 7B shows the result for the module without the resistor. In FIG. 7A, the resistance of the resistor is set to be 300 $\Omega$ same as the case shown in FIG. 6A. In these figures, the vertical axis denotes the alternate current (AC) composition involved in the monitored signal Vmon and the bias voltage Vpd. Essentially, the Vmon and the Vpd only involve the direct current (DC) composition. However, when the modulation current flows in the photodiode 16, a noise involving the AC composition may be induced in the Vmon and Vpd. As shown in FIG. 7A and FIG. 7B, the module with the resistor 18 shows the superior reduced noise in both the Vmon and the Vpd compared to the module without the resistor shown in FIG. 7B. Accordingly, the module with resistor 18 is capable of monitoring the optical output power therefrom accurately.

Second Embodiment

Figure 8:
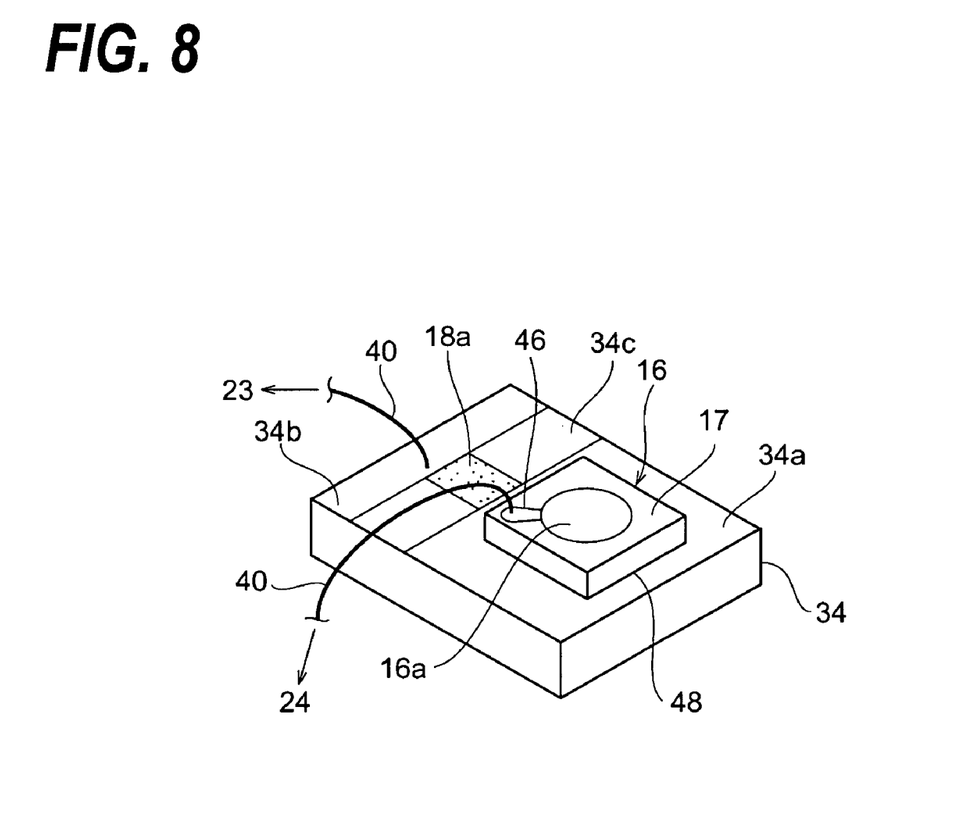
FIG. 8 shows the arrangement of the photodiode and the resistor according to the second embodiment of the invention.

Next, the second embodiment of the present invention will be described. FIG. 8 shows another arrangement of the photodiode 16 and the sub-mount 34. In the present embodiment, the resistor 18a is directly formed on the sub-mount 34. Another configurations may be similar to those shown in the laser module 100.

The sub-mount 34 of the present embodiment may be made of ceramic such as aluminum nitride (AlN), aluminum oxide ($Al_2O_3$), silicon carbide (SiC), and cubic boron nitride (C—BN). The sub-mount 34 may be, similar to the previous embodiment, a die capacitor. On the top surface of the sub-mount 34 is provided with two conductive layers 34a and 34b. The former conductive layer 34a is connected to the cathode electrode 48 of the photodiode 16, while the other conductive layer 34b is connected to the lead terminal 23 with the bonding wire 40. Between two conductive layers 34a and 34b is not covered with the conductive layer to isolate these two layers 34a and 34b electrically.

The resistor 18a is a thin film resistor formed in an area 34c between two conductive layers 34a and 34b. The resistor 18a is made of, similar to that 18 shown in the previous embodiment, NiCr and TaN, and preferably has a resistance from around 50 $\Omega$ to around 300 $\Omega$. The resistor 18a connects two conductive layers 34a and 34b. Accordingly, the resistor 18a is directly connected to the photodiode 16. Thus, the cathode electrode 48 of the photodiode 16 is connected to the lead terminal 23 via the resistor 18a.

Similar to the first embodiment, the lead terminal 23, which is also connected to the laser diode 16, is connected to the photodiode 14 via the resistor 18a. Therefore, the present laser module may realize the function same as the first embodiment. Moreover, by forming the resistor 18a directly on the sub-mount 34, the mounting area for the resistor 18a may be shrank, which may miniaturize the laser module 100. Moreover, the number of parts installed in the module 100 may be reduced, which simplifies the production of the module 100, thereby reducing the cost thereof.

Third Embodiment

Figure 9:
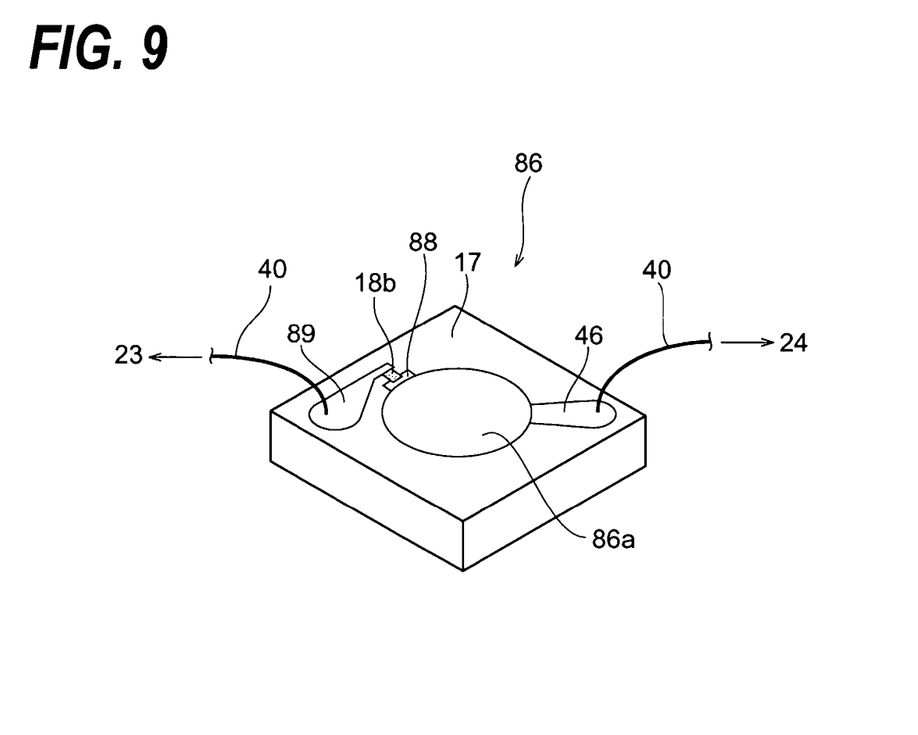
FIG. 9 shows the arrangement of the photodiode and the resistor according to the third embodiment of the invention.

Next, the third embodiment of the invention will be described. FIG. 9 is a perspective view showing the photodiode according to the third embodiment of the invention. In the present embodiment, the resistor 18b is integrated within the photodiode 86. Other arrangements are similar to those shown in the first embodiment.

The photodiode 86 includes the optical sensitive portion with the mesa structure 86a, but not restricted to such configuration. The optical sensitive portion 86a includes semiconductor layers forming the p-n junction or the p-i-n junction. The photodiode 86 is provides the cathode electrode 88 formed on the surface of the substrate 17. The cathode electrode 88 is connected to the n-type semiconductor layer involved in the optical sensitive portion 86a.

The resistor 18b is monolithically formed on the substrate 17 with the photodiode 86 and connected to the cathode electrode 88 thereof. The resistor 18b may be a metal thin film resistor with a substantially rectangular shape. Similar to the previous embodiment, the resistor 18b is made of NiCr, or TaN, with a resistance thereof from around 50 Ω to around 3 kΩ.

On the top surface of the substrate 17 is provided a pad 89 connected to one end of the resistor 18b. The other end of the resistor 18b is connected to the cathode electrode of the photodiode 86. The pad 89 is led to the lead terminal 23 with the bonding wire 40. Thus, the resistor 18b is connected in serial to the photodiode 86, and the cathode electrode 88 of the photodiode 86 is led to the lead terminal 23 via the resistor 18b. While the anode electrode 46 of the photodiode is directly connected to the lead terminal 24.

One modification of this arrangement illustrated in FIG. 9, the resistor 18b, though the metal thin film resistor is described, may be made of impurity diffused semiconductor layer. That is, impurity atoms are selectively implanted into a semi-insulating semiconductor substrate and the impurity-diffusing layer can be obtained by annealing. The sheet resistance of such impurity-diffusing layer is typically greater than that of the metal thin film resistor. Accordingly, the integrated resistor with high resistivity may be easily obtained. In this arrangement, since the substrate shows the semi-insulating characteristic, the photodiode can be directly, without any sub-mount, on the stem.

Also in the present laser module, the lead terminal 23, the photodiode 86 is connected to the lead terminal 23 via the resistor 18b, accordingly, the same function shown in the first embodiment may be realized in the present embodiment. Moreover, by forming the resistor 18b monolithically with the photodiode 86, the installing area for the resistor 18b may further shrunk, thereby further miniaturizing the laser module.

It should be noted that although the present invention has been thus described in embodiments, those skilled in the art will readily understand that the present invention is also capable in a variety of forms without departing from its spirit or essential characteristics.

For example, the laser module is not restricted to those having the CAN-type package, the module providing other types of package, such as the butterfly package, may be applicable for the present invention. Moreover, the embodiments commonly connect the anode electrode of the laser diode to the cathode electrode of the photodiode. In stead of this configuration, the anode electrode of the laser diode may be connected to the anode electrode of the photodiode, or the cathode electrode of the laser diode may be connected to the anode electrode or the cathode electrode of the photodiode.

The scope of the invention is, therefore, indicated by the appended claims rather than by the foregoing description. All changes, which come within the meaning and range of equivalency of the claims, are to be embraced within their scope.

What is claimed is:

1. A laser diode module, comprising:
   a laser diode having anode and cathode electrodes, said laser diode emitting light by providing a driving signal with a primary frequency component in a gigahertz band to said anode electrode of said laser diode;
   a photodiode for monitoring said light emitted from said laser diode, said photodiode having anode and cathode electrodes, said photodiode being provided with a bias voltage in said anode electrode of said photodiode and providing a monitoring signal from said anode electrode of said photodiode; and
   a thin film resistor connected between a first lead terminal and said cathode electrode of said photodiode;
   a co-axial package including a cap and a stem for mounting said laser diode, said photodiode and said thin film resistor in a space formed by said cap and said stem, said stem including said first lead terminal commonly connected to said anode electrode of said laser diode and said cathode electrode of said photodiode through said thin film resistor, said driving signal being provided to said anode electrode of said laser diode and said cathode electrode of said photodiode through said first lead terminal, wherein
   said thin film resistor has resistance between 50 Ω and 3 kΩ to isolate said monitoring signal brought from said anode electrode of said photodiode, from said driving signal supplied to said cathode electrode of said photodiode.

2. The laser diode module according to claim 1, wherein said photodiode is mounted on a first sub-mount, and said thin film resistor is mounted on a second sub-mount different from said first sub-mount, and
   said first and second sub-mounts are mounted on said stem of said co-axial package.

3. The laser diode module according to claim 2, wherein said first sub-mount is a die capacitor with an upper electrode and a lower electrode, said photodiode being mounted on said upper electrode, and
   said lower electrode faces said stem.

4. The laser diode module according to claim 1, wherein said photodiode and said thin film resistor are commonly mounted on a sub-mount that is mounted on said stem.

5. The laser diode module according to claim 4, wherein said sub-mount is a die capacitor with a first upper electrode, a second upper electrode and a lower electrode, said photodiode being mounted on said first upper electrode, said resistor being formed between said first upper electrode and said second upper electrode, and said lower electrode facing said stem.

6. The laser diode module according to claim 1,
wherein said photodiode and said thin film resistor are monolithically formed within a semiconductor substrate.

7. The laser diode module according to claim 1,
further including a second lead terminal and a third lead terminal, each different from said first lead terminal, said second lead terminal being connected to said cathode electrode of said laser diode, said third lead terminal being connected to said anode electrode of said photodiode to provide said bias voltage to said photodiode and to bring out said monitoring signal,
wherein said laser diode is driven in a differential mode by providing said driving signal with a first phase to said first lead terminal and another driving signal with a second phase opposite to said first phase to said second lead terminal.

8. A light transmitting apparatus, comprising:
a laser diode module including,
a laser diode having anode and cathode electrodes, said laser diode emitting light by providing a driving signal with a primary frequency component in a gigahertz band;
a photodiode having anode and cathode electrodes, said photodiode monitoring said light emitted from said laser diode, providing a monitoring signal from said anode electrode of said photodiode and being provided with a bias voltage to said anode electrode of said photodiode;
a thin film resistor connected between a first lead terminal and said cathode electrode of said photodiode, said thin film resistor having resistance between 50 Ω and 3 kΩ, and
a co-axial package including a cap and a stem for mounting said laser diode, said photodiode and said thin film resistor on said stem and in a space formed by said cap and said stem, said stem including said first lead terminal and second to fourth lead terminals different from each other, said first lead terminal being commonly connected to said anode electrode of said laser diode and said cathode electrode of said photodiode through said thin film resistor, said second lead terminal being connected to anode electrode of said photodiode to provide said bias voltage, said third lead terminal being connected to said stem, and said fourth lead terminal being connected to said cathode electrode of said laser diode; and
a driver with a first output terminal and a second output terminal, said first output terminal being connected to said first lead terminal of said laser diode module, and said second output terminal being connected to said second lead terminal, said driver being installed outside of said co-axial package,
wherein said laser diode is driven in a differential mode by providing said driving signal with a first phase to said first lead terminal and another driving signal with a second phase opposite to said first phase to said fourth lead terminal, and
said thin film resistor suppresses said driving signal provided to said first lead terminal to prevent said driving signal provided to said first lead terminal from affecting said photodiode.

9. The light transmitting apparatus according to claim 8,
wherein said driver further includes a current source connected to one of said first output terminal and said second output terminal, said current source providing a bias current to said laser diode mounted within said co-axial package.

10. The light transmitting apparatus according to claim 8,
wherein said photodiode is mounted on a first sub-mount, and said thin film resistor is mounted on a second sub-mount different from said first sub-mount, said first and second sub-mounts being mounted on said stem.

11. The light transmitting apparatus according to claim 10,
wherein said first sub-mount is a die capacitor with an upper electrode and a lower electrode, said photodiode being mounted on said upper electrode and said lower electrode facing said stem.

12. The laser diode module according to claim 8,
wherein said photodiode and said thin film resistor are mounted on said stem through a sub-mount.

13. The laser diode module according to claim 12,
wherein said sub-mount is a die capacitor with a first upper electrode, a second upper electrode, and a lower electrode, said photodiode being mounted on said first upper electrode, said thin film resistor being formed between said first upper electrode and said second upper electrode, and said lower electrode facing said stem.

14. The laser diode module according to claim 8,
wherein said photodiode and said thin film resistor are monolithically formed with a semiconductor substrate.

15. A laser diode module, comprising:
a laser diode having anode and cathode electrodes, said laser diode emitting light by providing a driving signal with a primary frequency component in a gigahertz range to said anode electrode of said laser diode;
a photodiode for monitoring said light emitted from said laser diode, said photodiode having anode and cathode electrodes, said anode electrode of said photodiode provided with a bias voltage thereto and bringing out a monitoring signal therefrom;
a thin film resistor connected between at least one lead terminal and said cathode electrode of said photodiode; and
a co-axial package including a cap and a stem for mounting said laser diode, said photodiode and said thin film resistor on said stem in a space formed by said cap and said stem, said stem including said at least one lead terminal connected to said anode electrode of said laser diode and to said cathode electrode of said photodiode through said thin film resistor, said driving signal being supplied to said at least one lead terminal,
wherein said thin film resistor isolates said photodiode from said driving signal supplied to said at least one lead terminal.

16. The laser diode module according to claim 15,
further comprising a capacitor connected between said cathode electrode of said photodiode and said stem.

17. A laser diode module, comprising:
a laser diode having anode and cathode electrodes, said laser diode emitting light by providing a driving signal with a primary frequency component in a gigahertz band to said anode electrode of said laser diode;
a photodiode for monitoring said light emitted from said laser diode, said photodiode having anode and cathode electrodes, said anode electrode of said photodiode being provided with a bias voltage thereto and bringing out a monitoring signal therefrom;
a thin film resistor connected between at least one lead terminal and said cathode electrode of said photodiode;
a co-axial package including a cap and a stem for mounting said laser diode, said photodiode and said thin film resistor on said stem in a space formed by said stem and said cap, said stem including said at least one lead terminal connected to said anode electrode of said laser diode and to said cathode electrode of said photodiode through said thin film resistor, said driving signal being supplied to said at least one lead terminal, wherein said thin film resistor is mounted on said stem through a sub-mount, and suppresses said driving signal from appearing in said monitoring signal.

* * * * *